United States Patent [19]
Eddleston et al.

[11] Patent Number: 4,560,079
[45] Date of Patent: Dec. 24, 1985

[54] EQUIPMENT ENCLOSURE

[75] Inventors: Michael J. Eddleston; Christopher Hume, both of Glasgow, Scotland

[73] Assignee: Burroughs Corporation, Detroit, Mich.

[21] Appl. No.: 576,247

[22] Filed: Feb. 2, 1984

[51] Int. Cl.⁴ .......................... B65D 7/42; B65D 7/00
[52] U.S. Cl. .................................. 220/4 R; 220/4 F; 220/76; 220/83; 220/84
[58] Field of Search ...................... 220/4 R, 4 F, 72.1, 220/75, 76, 77, 78, 83, 84, 67; 206/387, 389, 390, 391, 393, 403

[56] References Cited
U.S. PATENT DOCUMENTS

| | | | |
|---|---|---|---|
| 3,687,325 | 8/1972 | Simons | 220/4 F |
| 3,912,111 | 10/1975 | Marengoni | 220/4 R X |
| 4,300,016 | 11/1981 | Bergeron et al. | 220/4 R X |
| 4,334,260 | 6/1982 | Schmelter et al. | 220/4 R X |

Primary Examiner—Steven M. Pollard
Attorney, Agent, or Firm—Kevin R. Peterson; Edmund M. Chung; Mark T. Starr

[57] ABSTRACT

An equipment enclosure comprises a frame whereon edge covers can be assembled by means of lugs fitting into corresponding recesses in the frame. Each of the edge covers comprises a groove overhanging the frame on either side to form a continuous channel all around. Covers are slidably insertable into the continuous groove to trap the lugs in the recesses to prevent the removal of the edge covers, the edge covers in turn co-operating to retain the side covers. A back cover is boltable onto the frame to prevent the sliding out of the side covers and to complete the assembly of the enclosure. The edge covers are provided with projections and slots which are insertable one into the other between adjacent covers to lend added strength to the enclosure. In a modification to the invention an openable portion of the enclosure is provided.

28 Claims, 12 Drawing Figures

EQUIPMENT ENCLOSURE

The present invention relates to cases and enclosures for electronic, data processing, electrical, electromechanical, mechanical and pneumatic equipment and instruments. In the following description, the present invention is described in relation to an enclosure for a disc drive, being part of data processing equipment. It is to be understood that the scope of application of the invention is as wide as that described above and is not limited to data processing equipment.

A data processing disc drive is a piece of equipment which, in general, is neither of attractive appearance in itself nor suitable for use without some kind of enclosure providing support and protection thereto. It is the custom, not only with disc drives but with other electronic equipment, such as data processing units, to provide that the equipment is built within a frame. In the case of a disc drive, the frame is generally an integral part of the casting for the disc drive. In the case of other electronic equipment, the frame is generally used to support plural electronic cards together with power supplies. The principal aim of the frame is therefore to provide structural strength to the equipment in both cases. The frame is also in general provided with extra parts for accepting a plurality of covers making up the equipment enclosure. The covers are, in general, clipped and bolted on to the frame. The covers comprise not only the cover plates themselves, but also many other parts enabling them to be affixed to the frame. The frame itself also comprises elements designed to facilitate the attachment thereto of the covers.

The outward appearance of equipment is a major element in its attractiveness to a potential user. Not only must the enclosure be of good appearance, but it must also be of robust construction, allowing rough handling of the equipment and staying in place without damage. These requirements mean that the equipment enclosures can be costly. The necessity for assembling attachment elements onto the covers and onto the frame imposes a high labour cost, as does the necessity for employing labour to fix the covers onto the frame using the many fasteners and other devices common in the art.

It is desirable, from the point of view of cost and speed of manufacture, wherever possible, to make the panels for the enclosure in moulded thermosetting resin. The provision of fasteners and other attachment-enabling components, complicates the moulding procedure. Cores and other parts must be included in the mould prior to its being closed. This raises the price of the covers. Similarly, the affixing to the frame of fasteners and the like generally requires the drilling of holes and additional machining in the manufacture of the frame. This raises the price of the frame. In general the frame is a cast component and, whereas it costs nothing to include features in the casting, it costs additional time and labour to drill holes and to machine surfaces.

It is therefore desirable to provide an equipment enclosure of attractive appearance and robust construction which can be assembled to enclose the equipment in a very rapid manner. It is further desirable that such an equipment enclosure should comprise covers capable of being produced in a single moulding operation without the provision of inclusions in the mould. It is yet further desirable that the covers should be useable with a frame wherein the means of attachment of the covers to the frame can be formed as part of the frame casting process.

According to a first aspect, the present invention consists in an equipment enclosure wherein a plurality of covers are assembled around a frame, said enclosure being characterised by comprising; a first cover for covering a first face of said frame comprising a fixing lug there-beneath for removable insertion into a matching recess on a second face of said frame, contiguous with said first face, for holding said first cover onto said first face, and said first cover comprising a groove parallel to said second face along the line of contiguity between said first and second faces, by said enclosure further comprising a second cover, comprising a tongue for insertion into said groove during the assembly of said enclosure for said second cover to slide over said second face of said frame to trap said lug in said recess to prevent the removal of said first cover from said first face and for said first cover to hold said second cover in place on said second face by means of said groove, and by said equipment enclosure comprising a third cover, affixable on a third face of said frame, for engaging said second cover to prevent said second cover being slid out from said groove.

According to a second aspect, the present invention consists in an equipment enclosure according to the first aspect further characterised by comprising; a fourth cover, for affixing to a fourth face of said frame, contiguous with said first and second faces, in the same manner, in co-operation with said second cover, as for said first cover, where said first cover comprises a slot and said fourth cover comprises a projection, said projection engaging said slot for said first cover to assist in the prevention of the removal of said fourth cover from said fourth face of said frame.

In a preferred embodiment the enclosure comprises a frame having a first side face and a second side face. The frame is preferably the structural frame of a disc drive. The frame preferably comprises first second third and fourth edge faces corresponding in general terms with the four sides of a rectangular right prism having said first and second side faces as its edge. The first edge face is preferably at 90° to the second and fourth edge faces and parallel to the third edge face. The frame preferably comprises a first angled edge face preferably at 45° to and intermediate between the first edge face and the second edge face. The frame also preferably comprises a second angled edge face at 45° to and intermediate between the second edge face and the third edge face.

The enclosure preferably comprises a first edge cover for covering the first edge face. The first edge cover preferably comprises a first end for attachment to the first edge face proximately to the fourth edge face. The first edge cover preferably comprises a second end for attachment to said first edge face proximately to said first angled edge face. The cover preferably comprises a first angled edge cover for attachment on said first angled edge face. The first angled edge cover preferably comprises a first end for attachment proximately to said first edge cover. The first angled edge cover preferably comprises a second end for attachment onto said frame proximately to said second edge face.

The enclosure preferably comprises a second end cover for attachment to the second edge face of the frame. The second edge cover preferably comprises a first end for attachment on said frame proximately to said first angled edge cover. The second edge cover preferably comprises a second end for attachment to said frame proximately to said second angled edge face.

The enclosure preferably comprises a second angled edge face cover having a first end for attachment to said frame proximately to said second edge cover and a second end for attachment to said frame proximately to said third edge face.

The enclosure preferably comprises a third edge face cover having a first end for attachment to said frame proximately to said second angled edge face cover and a second end for attachment to said frame proximately to said fourth edge face.

The first, second and third edge covers and the first and second angled edge covers preferably overlap their respective faces on the frame to over-hang the first and second side faces. The first, second and third edge covers and the first and second angled edge covers preferably comprise a groove on either side of the frame mating with the grooves in the other covers so that a continuous groove is formed in the covers parallel to the first and second side faces, in the common extension of the covers, on either side of the frame, beyond the first and second side faces.

Each of the edge covers is preferably provided with a plurality of lugs for fitting into a corresponding plurality of recesses, of complimentary outline to said lugs, in that part of the first and second side faces adjacent to the face covered in each case. The lugs preferably fit into the recesses to form a continuous surface with the first and second side faces, the lugs comprising projections, fitting into corresponding indentations, for preventing the withdrawal of their associated cover from its associated face.

With the first second and third edge covers assembled on the frame together with the first and second angled edge covers, a first sliding, side cover having a tongue around its periphery can preferably be slid into the continuous groove around the overlap on the first side face to cover the first side face. A second sliding side face, also having a tongue continuously formed around the edge thereof, is preferably slideable into the continuous groove around the extension of the edge covers over the second side face to cover the second side face of the frame. The sliding covers slide over the lugs in the recesses, trapping the lugs in the recesses and preventing their removal therefrom, thereby securely holding the edge covers in place.

The enclosure preferably comprises a back cover for attachment by means of a plurality of half-turn quick release catches to the fourth edge face of the frame. The fourth edge cover preferably comprises grooves approximate to the first and second side faces of the frame, mating with the continuous groove in the other covers, to accept the tongue on the side covers. The side covers are thereby preferably held on the first and second side faces by a groove continuously extending around their periphery and mating with a similarly extensive tongue.

The lugs preferably comprise an end projection for fitting into a corresponding indentation in the recesses. The end projection of the lug is preferably provided at the distal end of a flexible arm. The flexible arm is preferably affixed beneath the corresponding edge cover extending in the direction of the first or second side faces at 90° to the plane of the edge cover in question. The arms are preferably elastic and the lugs are preferably formed integrally with the formation of the covers by a common moulding process.

The ends of the edge covers preferably consist in 2 types. In a first type a projection is provided extending towards the next edge cover around on the frame. In the second type a slot is provided for accepting the projection in the adjacent edge cover. The first end of the first edge cover is preferably of the first type. The second end of the first edge cover is preferably of the first type. The first end of the first angled edge cover is preferably of the second type and the second end of the first angled edge cover is preferably of the first type. The first end of the second edge cover is preferably of the second type and the second end of the second edge cover is preferably of the second type. The first end of the second angled edge cover is preferably of the first type and the second end of the second angled edge cover is preferably of the second type. The first end of the third edge cover is preferably of the first type and the second end of the third edge cover is preferably of the first type. The first and second ends of the back cover are preferably of the second type. The projection preferably co-operates with the slot such that one cover prevents the removal of another for the increase in overall mechanical strength of the enclosure.

The edge covers are each preferably made in a one-shot moulded action in a single mould requiring no inclusions to be made therein during the moulding process. The mould preferably comprises a central block corresponding in size and outline to the face of the frame whereon the particular cover is to be situated. The central block comprises indentations of the same shape and size as the recesses on the frame. A surrounding collar preferably forms a precise fit over the central block to define the outer edges of the lugs and the bottom of the cover in common with the top surface of the central block. The surrounding collar preferably comprises spines on the upper surface thereof adjacent to the central block for defining the grooves on the underside of the edge cover to be formed. A top cover of the mould preferably covers both the central block and the surrounding cover to define the outer surface of the edge cover to be formed. In use, the mould is preferably closed and a thermosetting resin is injected therein. After moulding the mould is preferably opened leaving the edge cover so formed sitting on the central block as if it were sitting on the frame. The edge cover so formed can then preferably be removed from the central block by removing the lugs from the indentations on the central block in the same manner as if the formed edge cover were being removed from its position on the frame.

In a variation upon the preferred embodiment, preferred for use when the first edge cover supports, for example, a keyboard, the first angled edge cover is preferably hinged onto the second end of the first edge cover to provide an inspection hatch. The modified first angled edge cover so formed, preferably comprises a projection at its distal end for fitting into the slot on the first end of the second edge cover. The modified first angled edge cover is preferably held onto a hinge pivot, beneath the first edge cover, by a hinge arm. The modified first angled edge cover preferably is rotatable about the hinge pivot for the projection on the distal end thereof to engage the slot in the first end of the second edge cover, so closing the enclosure.

Figure 1:
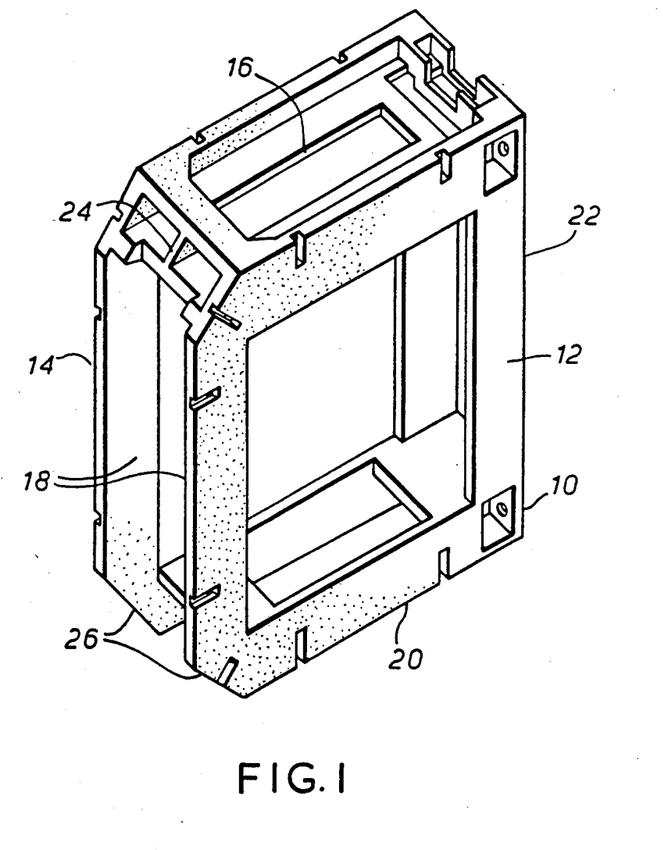
FIG. 1 shows a perspective view of the supporting frame of the enclosure.

The present invention is further explained by the following description in conjunction with the appended drawings in which:

FIG. 1 shows a perspective view of the frame 10 of the enclosure.

The frame 10 comprises a first side face 12, a second side face 14, a first edge face 16, a second edge face 18, a third edge face 20, a fourth edge face 22, a first angled edge face 24 and a second angled edge face 26. The first angled edge face 24 is provided intermediately between the first edge face 16 and the second edge face 18, the first angled edge face 24 being at 45° to both the first edge face 16 and the second edge face 18, which two are therefore at 90° to one another. The second angled edge face 26 is provided intermediately between the second edge face 18 and the third edge face 20. The second angled edge face 26 is at 45° to both the second edge face 18 and the third edge face 20, which two edge faces are therefore at 90° to one another. The fourth edge face 22 is provided intermediately between the first edge face 16 and the third edge face 20. The first and second side faces 12, 14 are contiguous with all of the edge faces 16, 18, 20, 22 and with both the angled edge faces 24, 26. The side faces 14, 12 are parallel to one another and each have a plane at 90° to the planes of each of the edge faces 16, 18, 20, 22 and of the angled edge faces 24, 26.

The frame shown in FIG. 1 is for use as an integral part of a disc drive. As such, the frame 10 can be either part of the mechanical support used in the construction of the disc drive or can be an additional frame wherein the disc drive is held. It will become apparent to those skilled in the art how the frame 10 can be used as an integral part of the equipment to be enclosed. Whilst the equipment enclosed in the preferred example is a disc drive, those skilled in the art will appreciate that many other kinds of equipment can be so enclosed.

When used as an enclosure for the disc drive, as described, the frame 10 also includes galleries and other parts for the ventilation of the disc drive, whose use and importance will become apparent with later description.

Figure 2:
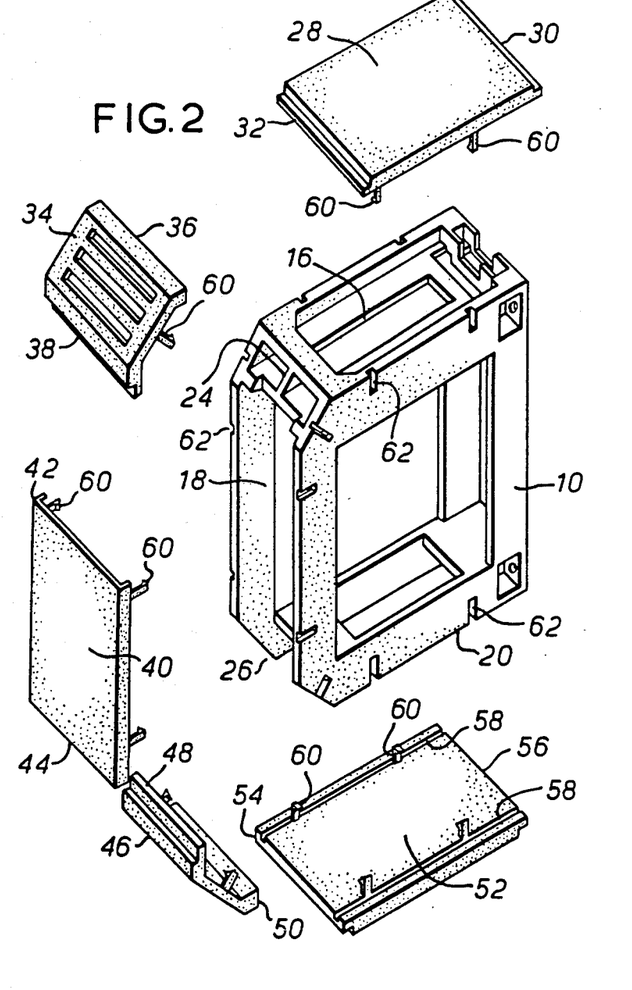
FIG. 2 shows an exploded, perspective view of the edge covers and the angled edge covers about to be assembled onto the frame of FIG. 1.

FIG. 2 shows an exploded, perspective view of the frame 10 with edge covers and angled edge covers about to be assembled thereon.

A first edge cover 28 having a first end 30 and a second end 32 is assembleable to cover the first edge face 16, with the first end 30 falling proximately to the abuttment with the fourth edge face 22. The second end 32 of the first edge cover 28 lies proximate to the abuttment with the first angled edge face 24. A first angled edge cover 34, having ventilation slots therein, for assembly onto the frame 10 to cover the first angled edge face 24, has a first end 36 proximate to the abuttment between the first angled edge face 24 and the first edge face 16 and a second end 38 proximate to the abuttment between the second edge face 18 and the first angled edge face 24. A second edge cover 40 is assembleable onto the frame 10 to cover the second edge face 18. The second edge cover 40 comprises a first end 42 for assembly proximately to the abuttment between the first angled edge face 24 and the second edge face 18 and a second end 44 for assembly proximately to the abuttment between the second edge face 18 and the second angled edge face 26. A second angled edge cover 46 is assembleable onto the second angled edge face 26 and has a first end 48 for assembly proximately to the abuttment between the second edge face 18 and the second angled edge face 26 and a second end 50 for assembly proximately to the abuttment between the second angled edge face 26 and the third edge face 20. A third edge face cover 52 is assembleable onto the frame 10 to cover the third edge face 20 and has a first end 54 for assembly proximately to the abuttment between the second angled edge face 26 and the third edge face 20 and a second end 56 for assembly proximately to the abuttment between the third edge face 20 and the fourth edge face 22. The edge face covers 28, 34, 40, 46, 52 are each provided with a groove 58 which lies out-with the frame 10 when each cover 28, 34, 40, 46, 52, is in place. This groove 58 is visible in FIG. 2 only in the third edge face cover 52 imply because of the angle of the perspective view. It is to be appreciated that that same groove 58 appears in a similar position on all of the covers 28, 34, 40, 46.

Each of the covers 28, 34, 40, 46, 52 is provided with lugs 60 projecting there-beneath for fitting into recesses 62 on the frame. Each of the covers 28, 34, 40 46, 52 is provided with a plurality of lugs 60 for fitting into a corresponding plurality of recesses 62. Whilst the edge covers 28, 40, 46, 52 are here shown each comprising 4 lugs 60, for fitting into a corresponding 4 recesses 62, it is to be appreciated that more or fewer than 4 lugs may be used. Similarly whereas the angle edge covers 34, 46 are here shown as each comprising only 2 lugs 60 for fitting into a corresponding pair of recesses 62, it is to be appreciated that more than 2 lugs 60 may be used in each case.

Figures 3, 4:
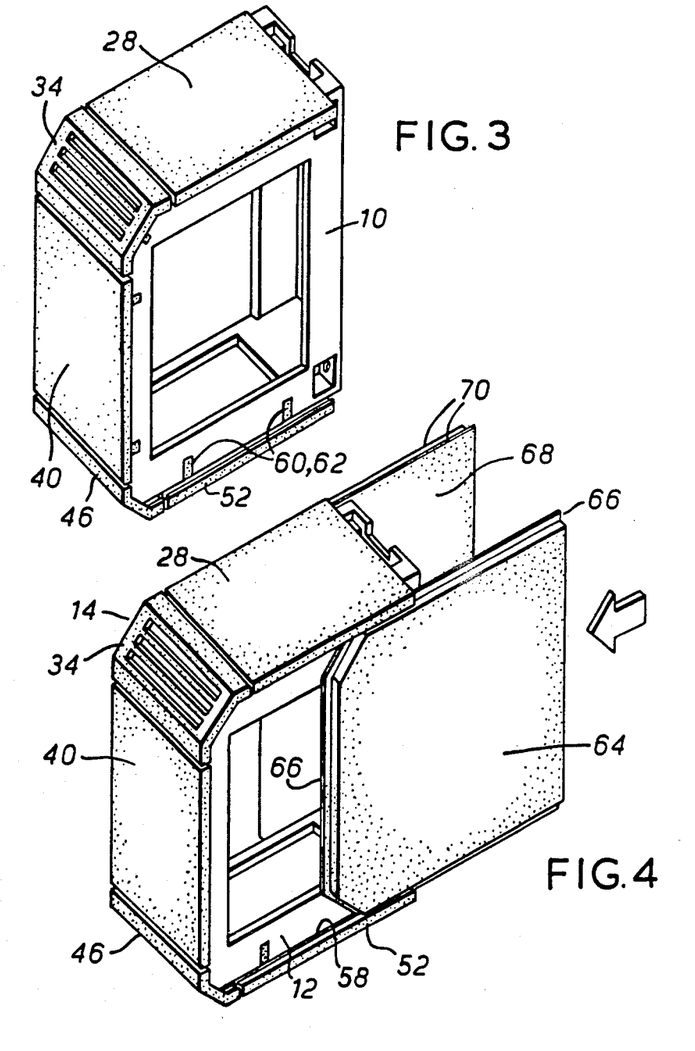
FIG. 3 shows a perspective view of the edge covers and the angled edge covers of FIG. 2 now assembled onto the frame.
FIG. 4 shows a perspective view of the sliding side covers being inserted onto the frame bearing the edge covers and the angled edge covers shown in FIG. 3.

FIG. 3 shows a perspective view of the frame 10 of FIG. 2 with the covers 28, 34, 40, 46, 52 assembled thereon.

In the assembly, each of the lugs 60 is inserted into the corresponding recess 62 on the frame 10 for the lugs 60 to lie flush in the recesses substantially parallel planarly with the sides 12, 14 of the frame. The second end 32 of the first edge cover 28 mates with the first end 36 of the first angled edge cover 34. The second end 38 of the first angled edge cover 34 mates with the first end 42 of the second edge cover 40. The second end 44 of the second edge cover 40 mates with the first end 48 of the second angled edge cover 46. The second end 50 of the second angled edge cover 46 mates with the first end 54 of the third edge cover 52. The manner of this mating and the way in which it is used to impart mechanical strength to the enclosure as a whole is described at a later point.

The edge covers 28, 34, 40, 46, 52, as shown in FIG. 3, can be inserted with the lug 60 onto the recesses 62 or removed therefrom by hand.

FIG. 4 shows the frame 10 and the edge covers 28, 34, 40, 46, 52 of FIG. 4 with the addition of side covers being added.

A first side cover 64 comprises a tongue 66 extensive all around its periphery. The tongue 66 is insertable into the groove 58 which joins up in all of the covers 28, 34, 40, 46, 52 to form a continuous channel around 3 sides of each of the side faces 12, 14. The continuous channel formed by the mating of the grooves 58 lies just outside the plane of each side face 12, 14 in the portion of each edge cover 28, 34, 40, 46, 52 which overhangs the side faces, 12, 14. The first side face 64 slides into the common channel formed by the mating of the grooves 58 to fit exactly between the edge covers 28, 34, 40, 46, 52 such that its outer surface is flush with the edges of the edge covers, 28, 34, 40, 46, 52.

A second sliding side cover 68 is provided to cover the second side face 14 of the frame 10. The second sliding side cover 68 is provided with a tongue 70 right round the edge thereof for sliding in the groove 58 under each of the covers 28, 34, 40, 46, 52. The second sliding edge cover 68 is identical to the first sliding edge cover 64, merely being a mirror image thereof.

Figures 5, 6:
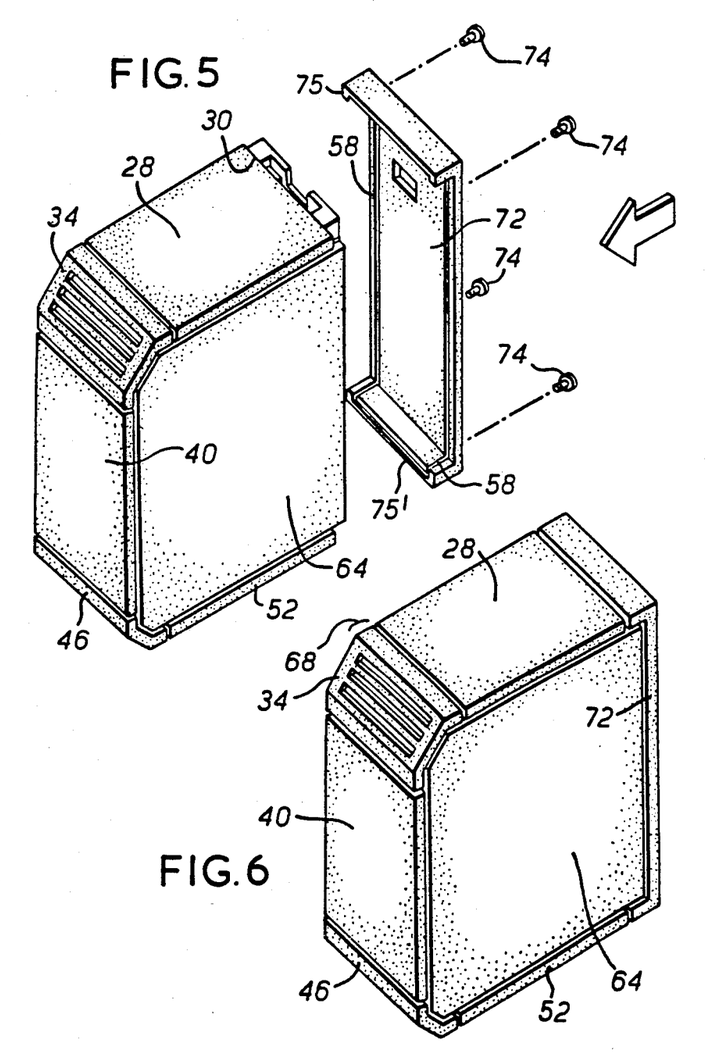
FIG. 5 shows an exploded, perspective view of the back cover of the enclosure about to be assembled onto the frame bearing the edge covers, the angled edge covers, and the sliding side covers as shown in FIG. 4.
FIG. 6 shows a perspective view of the completely assembled enclosure whose various stages of assembly are shown in FIGS. 1 to 5.

FIG. 5 shows a perspective view of the enclosure of FIG. 4 with the edge covers 28, 34, 40, 46, 52 assembled thereon together with an exploded view of the back cover about to be placed on the frame 10.

The back cover 72 has affixable therein 4 quick release catches 74. The quick release catches 74 pass through holes in the back cover 72 wherein they are free to rotate. The quick release catches 74 are insertable onto mating parts within the frame 10 and can be closed or opened by means of a half turn using a coin, screwdriver or the like, in a manner well known in the art.

The back cover 72 comprises a first end 75 formating with the first end 30 of the first edge cover 28. The back cover 72 also comprises a second end 75' for mating with the second end 56 of the third edge cover 52.

Cable strain relief bushes and the like are preferably affixed in the back cover 72 since it enjoys an enhanced degree of mechanical strength through being affixed to the frame 10 by means of the quick release catches 74.

FIG. 6 shows the completed enclosure with all covers 28, 34, 40, 46, 52, 64, 68, 72 in place.

With the covers 28, 34, 40, 46, 52, 64, 68, 72 in place, the tongues 66 70 on the first and second sliding side covers 64, 68, mate with grooves 58 in the back cover 72. The back cover 72 being affixed to the frame 10, the sliding side covers 64, 68 are prevented from disengaging from the continuous channel formed by the groove 58 about each side face 14, 12. The side covers 64, 68 co-operate, in a manner to be explained later, with the lugs 60 and the recesses 64 to prevent the edge covers 28, 34, 40, 46, 52 from being removed. Similarly, the edge covers 28, 34, 40, 46, 52 prevent the removal of the side covers 68, 64 in a direction perpendicular to the side faces 12, 14. The back cover 72 prevents the sliding-out of the side covers 64, 68 and thus locks the whole enclosure together.

The first edge cover 28 does not extend quite to the abuttment between the first edge face 16 and the first angled edge face 24 nor quite to the abuttment between the first edged face 16 and the fourth edge face 22. The second edge cover 40 does not extend quite to the abuttment between the first angled edge face 24 and the second edge face 18, nor does it extend quite to the abuttment between the second edge face 18 and the second angled edge face 26. The third edge cover 52 does not extend quite to the abuttment between the second angled edge face 26 and the third edge face 20 nor does it extend quite to the abuttment between the third edge face 20 and the fourth edge face 22. The back cover 72 wraps around a short distance onto the first edge face 16 and the third edge face 20 to make the abuttment with the first edge cover 28 and the third edge cover 52 respectively. The first angled edge cover 34 wraps around a short distance onto the first edge face 16 and the second edge face 18 to make the abuttment with the first edge cover 28 and the second edge cover 40 respectively. The second angle edge cover 46 wraps around a short way onto the second edge face 18 and the third edge face 20 to make the abuttment with the second edge face cover 40 and the third edge face cover 52 respectively.

The abuttment between the covers 72, 28, 34, 40, 46, 52, not being precisely at the corners, lends a smoothness to the outline of the enclosure and strengthens the enclosure against coming apart should it be dropped on a corner.

Figure 7:
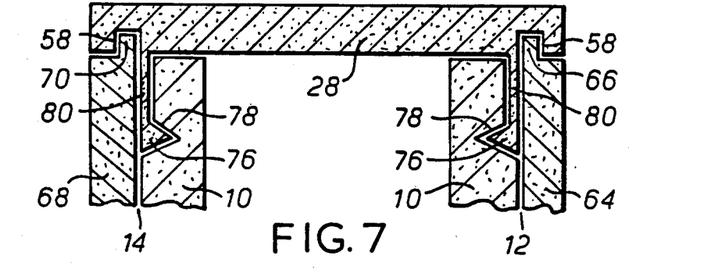
FIG. 7 shows a cross sectional view of the first edge cover, the first and second sliding side covers, the frame, and the lugs, illustrating the manner of holding the edge covers onto the frame.

FIG. 7 shows a cross section through the enclosure of FIG. 6, including additional details of the lugs 60 and the recesses 62.

The tongues, 66, 70 respectively of the first and second side covers 64, 68 fit into the groove 58 in the first edge cover 28. It is to be appreciated that a similar view could be obtained with any of the other edge covers 34, 40, 46, 52. Each of the lugs 60 comprises an end projection 76 which fits into a complimentary indentation 78 in the recess 62. The end projection 76 of each lug 60 is at the distal end of a flexible arm 80.

In assembly, the projections 76 of each of the lugs 60 on each cover 28, 34, 40, 46, 52 are inserted into the recesses 62, flexing as they do so. As the cover 28 reaches its correct position, the projection 76 falls into the indentation 78 to hold the cover 28 in place.

When the arm 80 and the projection 76 are in place, they together lie flush with the surface 12, 14 of the frame 10. When the sliding side covers 64, 68 are assembled onto the sides 12, 14 of the frame 10, they cover the lugs 60 in the recesses 62 and prevent in any way their withdrawal therefrom. Thus with the sliding side faces 64, 68 in place in the groove 58 the lugs 60 cannot be removed from the recesses 62. The side covers 64, 68 and the edge cover 28 therefore co-operate to hold one another onto the frame 10.

Whilst the projections 76 of the lugs 60 have here been shown as being of approximately triangular shape, those skilled in the art will appreciate that lugs of other shapes may be so used. In particular, the arms 80 may be made slightly short so that the projections 76 are a little short of full entry into the indentation 78. In this way the combination of elastic force when the side covers 64 68 are not assembled and of mechanical pushing by the side covers 64, 68 when they are assembled, pulls the first edge cover 28 onto the frame 10.

It is to be appreciated that each of the edge covers 28, 34, 40, 46, 52 is held on in exactly the same manner.

Whilst it is here shown that each of the lugs 60 is a discreet device, it is to be appreciated that a continuous lug 60 can be made beneath each cover 28, 34, 40, 46, 52 extending the entire length of the engagement of that cover with the frame 10 and insertable into a correspondingly extensive recess 62 in the frame 10. It is preferred that the lugs 60 and the recesses 62 are a finite extent within the range of each cover 28, 34, 40, 46, 52 so that sliding is prevented parallel to each cover 28, 34, 40, 46, 52.

Figures 8, 9:
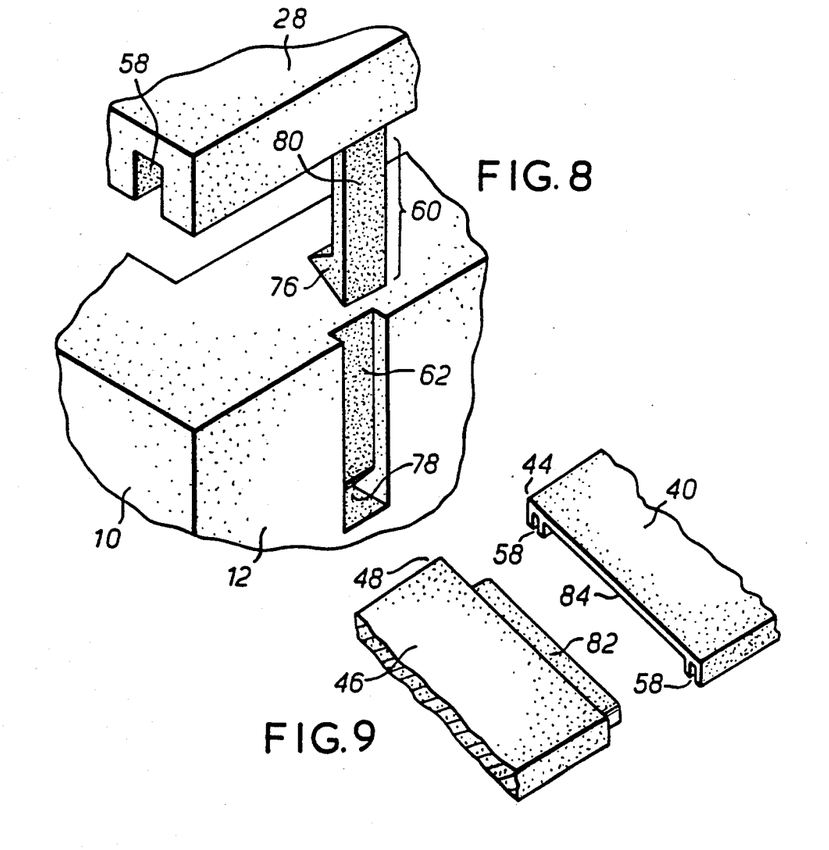
FIG. 8 shows perspective detail of the lugs on the edge covers and of the recesses in the frame.
FIG. 9 shows a perspective view of the 2 different types of ends used on the edge covers.

FIG. 8 shows a perspective view of detail of the lugs 60 and the recesses 62.

As the first edge cover 28 is inserted onto the frame 10, the projection 76 on the arm 80 falls into the groove of the recess 62 in the first side face 12. The arm 80 flexes to allow the outward movement of the projection 76. As the first edge cover 28 continues to be inserted onto the frame 10, the projection 76 travels down the groove of the recess 62 until, when the first edge cover 28 is almost in position, the projection 76 falls into the indentation 78 in the recess 62. The arm 80 unflexes allowing the projection 76 to fall into the indentation 78. The arm 80 exactly fills the groove in the recess 62 bringing the surface of the combination of the arm 80 in the recess 62 flush with the first side face 12 of the frame 10. The projection 76 in the indentation 78 prevents the removal of the first edge face cover 28. The groove 58 in the first edge face cover 28 falls beyond the edge of the frame 10 to overhang the first side face 12.

It is to be appreciated that FIG. 8 shows the detail of only one of the lugs 60, and that all of the lugs 60 in the enclosure are the same. All other covers 28, 34, 40, 46, 52 are assembled in the same manner. The arm 80 and the recess 62 does not have to form an exact flush fit. The arm 80 can project a little way above the first side face 12 allowing the first side cover 64 to push thereon a little way to give added strength to the arrangement.

FIG. 9 is illustrative of the manner in which the end of the edge covers 28, 34, 40, 46, 52 mate together to lend yet further strength to the enclosure.

In FIG. 9, for the sake of illustration, there is shown the first end 48 of the second angle edge cover 46 and the second end 44 of the second edge cover 40.

The first end 48 of the second angled edge cover 46 is of a first type. This first type of end comprises a projection 82 extensive towards the neighbouring edge cover. The second end 40 of the second edge cover 40 represents a second type of end. The second type of end comprises a slot 84 therein. With the covers 28, 34, 40, 46, 52, 72 assembled, ends of the first type always mate with ends of the second type. The projections 82 fit into the slots 84 for the covers to co-operate in preventing their removal from the frame 10. The first and second ends 32 32 of the first edge cover 28 are of the first type. The first end 36 of the first angled edge cover 34 is of the second type and the second end 38 of the first angled edge cover 34 is of the first type. The first and second ends 42, 44 of the second edge cover 40 are of the second type. The first end 48 of the second angled edge cover 46 if of the first type and the second end 50 of the second angled edge cover 46 is of the second type. The first and second ends 54, 56 of the third edge cover 52 are of the first type. The first and second ends 75, 75'- of the back cover 72 are of the second type. When the enclosure is assembled the projections 82 mate with the slots 84 in the adjacent covers 72, 28, 34, 40, 46, 52 to prevent the removal of the covers.

Figure 10:
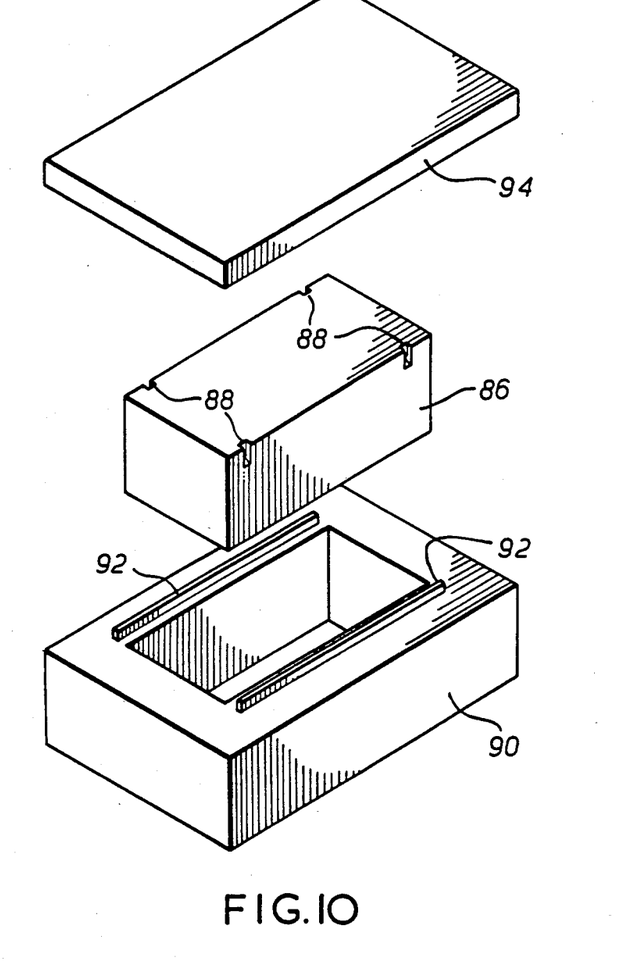
FIG. 10 shows an exploded perspective view of the mould used for casting the edge covers.

FIG. 10 shows a mould or die for the one-shot moulding of an edge cover 28, 34, 40, 46, 52 complete with lugs 60.

The mould comprises a central block 86 having lug-shaped indentations 88 set in the top edge thereof. The mould also comprises a surrounding collar 90. The surrounding collar 90 exactly fits around the central block 86 to define the outer edges of the lugs 60. The surrounding collar comprises spines 92 on the upper face thereof, proximate to the indentations on the central block 86 for forming the groove 58 in the cover. The mould lastly comprises a top plate 94, hollowed out on the underside for defining the outer surface of the cover 28, 34, 40, 46, 52 to be made. When the mould is assembled the central block 86 is placed within the surrounding collar 90 and the top cover 94 placed over both. Thermosetting resin or any other acceptable material is then injected into the mould and moulded. At the end of the moulding operation, the top cover 94 is removed and so is the surrounding collar 90. The moulded edge cover 28, 34, 40, 46, 52 so far remains seated on the central block 86 as if it were sitting on the frame 10. The newly moulded edge cover 28, 34, 40, 46, 52 is then sprung from the central block 86 simply by opening its lugs 60 as if it were being removed from the frame 10.

Figure 11:
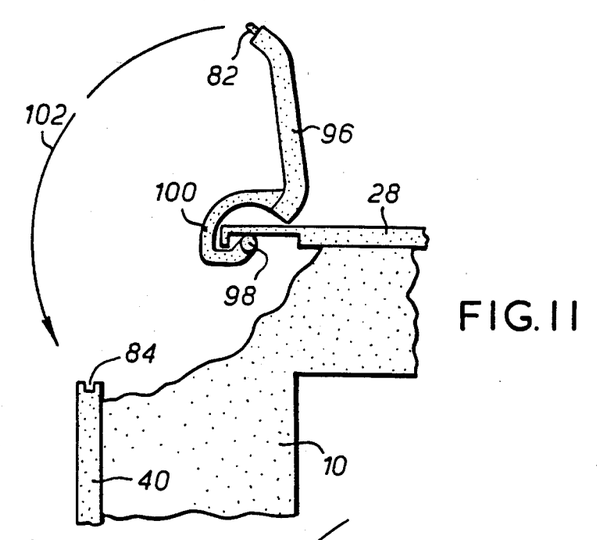
FIG. 11 shows a cross sectional view through the assembled enclosure with a modified first angled edge cover in an open position.

FIG. 11 shows a modification over the preferred embodiment so far described preferred for use when the first edge cover 28 has mounted thereon a keyboard or some other such feature when the enclosed equipment is not a disc drive.

The first angled edge cover 34 is replaced with a modified angled edge cover 96. The modified angled edge cover 96 is rotatable about a pair of hinged pivots 98 fixed beneath the ends of the first edge cover 28. The modified first angled edge cover 96 is held on the hinge pivots 98 by a hinge arms 100. The modified angled edge cover 96 comprises a projection 82 at the distal end thereof. The projection 82 operates to engage slot 84, just as before, when the modified first angled edge cover 96 is rotated about the hinge pivots 98 in the direction of the arrow 102. The modified first angled edge cover 96 is shown in FIG. 11 in the open position.

Figure 12:
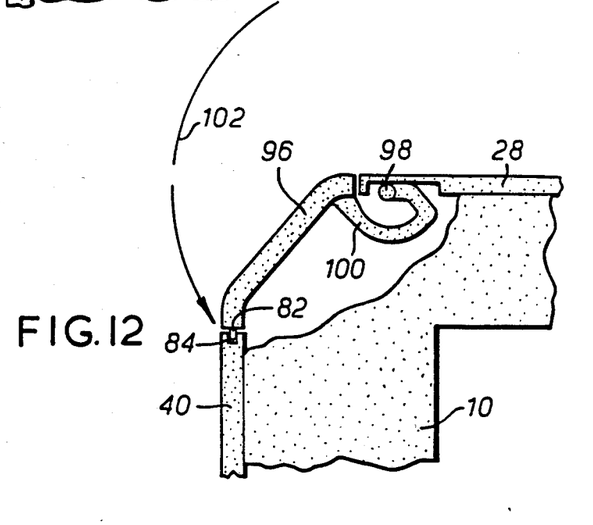
FIG. 12 shows the cross sectional view of FIG. 11 with the modified angled edge cover in a closed position.

FIG. 12 shows the modified first angled edge cover of FIG. 11 in the closed position.

The modified first angled edge cover 96 has rotated for the hinge arm 100 to be concealed beneath the first edge cover 28. The projection 82 has mated with the slot 84, clicking into place to lend strength to the arrangement.

The modified angled edge cover 96 in this embodiment, is preferred to comprise a transparent window for inspecting lights, switches and the like within the enclosure. The modified angled edge cover 96 is preferred to be openable by means of a handle, a groove or some other means of gripping the cover 96.

It is to be appreciated that it need not be merely the angled edge covers 34, 46 that are replaced in this manner. Whilst the present invention has so far been described with reference to an enclosure having 2 sides, 4 edges and 2 angled edges, it is to be appreciated that shapes other than those described can be enclosed using the present invention.

Whilst the present invention has so far been described with reference to enclosing disc drives and other electronic and electro-mechanical equipment, it is to be appreciated that other equipment than that described can be accommodated within such an enclosure. In particular, chemical equipment, electrical and other electro-mechanical equipment can be so accommodated, together with mechanical items.

Whilst the first angled edge cover 34 has been described as comprising ventilation slots, it is to be appreciated that some or all of the covers 28, 34, 64, 68 40, 46, 52, 72 can be free of any features or can comprise windows, ventilation slots, cable entries, cable strain relief members, connectors and the like.

What we claim is:

1. An equipment enclosure wherein a plurality of covers are assembled around a frame, said enclosure comprising:
a first edge cover for covering a first face of said frame, said first edge cover in turn comprising a fixing lug there-beneath for removable insertion into a matching recess on a second face of said frame, said second face of said frame being contiguous with said first face of said frame, for holding said first edge cover onto said first face, and said first edge cover further comprising a groove parallel to said second face along the line of contiguity between said first and second faces;
a sliding cover in turn comprising a tongue for insertion into said groove during the assembly of said enclosure for said sliding cover to slide over said second face of said frame to trap said lug in said recess to prevent the removal of said first edge cover from said first face and for said first edge cover to secure said sliding cover on said second face by means of said groove; and
a back cover, affixable on a third face of said frame, for engaging said sliding cover to prevent said sliding cover being slid out from said groove.

2. An equipment enclosure according to claim 1 comprising; a second edge cover, for affixing to a fourth face of said frame, contiguous with said first and second faces, in the same manner, in co-operation with said sliding cover, as for said first edge cover, where said first edge cover comprises a projection and said second edge cover comprises a slot, said projection engaging said slot for said first edge cover to assist in the prevention of the removal of said second edge cover from said fourth face of said frame.

3. An equipment enclosure according to claim 2 wherein said first edge cover is a one-shot moulded cover, said first edge cover being moulded in a single moulding operation employing a mould comprising; a central block conformal with the portion of said frame whereon said first edge cover is to be affixed, said central block comprising an indentation corresponding with said recess; a close fitting collar wherein said central block is removeably insertable upon assembly of said mould; and a top plate, said central block, said collar and said top plate being co-operative upon assembly of said mould to define a void, with which said indentation is in communication, for defining the outline of said first edge cover; where plastic material is introduced into said void and solidified and where, upon dis-assembly of said mould, said first edge cover can be removed from said central block in the same manner as said first edge cover can be removed from said frame.

4. An equipment enclosure according to claim 3 wherein said plastic material is thermosetting resin to be cured in said mould.

5. An equipment enclosure according to claim 4 wherein said back cover comprises one or more quick release catches, through penetrative thereof for engaging said third face of said frame to hold said back cover onto said third face of said frame.

6. An equipment enclosure according to claim 5 wherein said back cover comprises a cable strain relief bush for the transfer of strain to said back cover for said strain to be transmitted through said one or more quick release catches, to said third face of said frame.

7. An equipment enclosure according to claim 6 wherein said second edge cover comprises one or more ventilation openings for the ventilation of the interior of said enclosure.

8. An equipment enclosure according to claim 7 wherein said frame is adapted for the support of a data processing apparatus.

9. An equipment enclosure according to claim 8 wherein said data processing apparatus is a data storage disc drive.

10. An equipment enclosure according to claim 6 wherein said second edge cover comprises a hinge, coupled to said frame, for said second edge cover to be rotated thereabout to be opened for the inspection of the interior of said enclosure.

11. An equipment enclosure according to claim 10 wherein said frame is adapted for the support of a data processing apparatus.

12. An equipment enclosure according to claim 10 wherein said data processing apparatus is a data storage disc drive.

13. An equipment enclosure according to claim 2 wherein said back cover comprises one or more quick release catches, through penetrative thereof for engaging said third face of said frame to hold said back cover onto said third face of said frame.

14. An equipment enclsoure according to claim 13 wherein said back cover comprises a cable strain relief bush for the transfer of strain to said back cover for said strain to be transmitted through said one or more quick release catches to said third face of said frame.

15. An equipment enclosure according to claim 14 wherein said second edge cover comprises a hinge, coupled to said frame, for said second edge cover to be rotated thereabout to be opened for the inspection of the interior of said enclosure.

16. An equipment enclosure according to claim 15 wherein said frame is adapted for the support of a data processing apparatus.

17. An equipment enclosure according to claim 16 wherein said data processing apparatus is a data storage disc drive.

18. An equipment enclosure according to claim 14 wherein said second edge cover comprises one or more ventilation openings for the ventilation of the interior of said enclosure.

19. An equipment enclosure according to claim 18 wherein said frame is adapted for the support of a data processing apparatus.

20. An equipment enclosure according to claim 19 wherein said data processing apparatus is a data storage disc drive.

21. An equipment enclosure according to claim 1 wherein said back cover comprises one or more quick release catches, through penetrative thereof for engaging said third face of said frame to hold said back cover onto said third face of said frame.

22. An equipment enclosure according to claim 21 wherein said back cover comprises a cable strain relief bush for the transfer of strain to said back cover for said strain to be transmitted through said one or more quick release catches to said third face of said frame.

23. An equipment enclosure according to claim 22 wherein said second edge cover comprises a hinge, coupled to said frame, for said second edge cover to be rotated thereabout to be opened for the inspection of the interior of said enclosure.

24. An equipment enclosure according to claim 23 wherein said frame is adapted for the support of a data processing apparatus.

25. An equipment enclosure according to claim 24 wherein said data processing apparatus is a data storage disc drive.

26. An equipment enclosure according to claim 22 wherein said second edge cover comprises one or more ventilation openings for the ventilation of the interior of said enclosure.

27. An equipment enclosure according to claim 26 wherein said frame is adapted for the support of a data processing apparatus.

28. An equipment enclosure according to claim 27 wherein said data processing apparatus is a data storage disc drive.

* * * * *